United States Patent
Spory et al.

(10) Patent No.: US 10,177,056 B2
(45) Date of Patent: Jan. 8, 2019

(54) REPACKAGED INTEGRATED CIRCUIT ASSEMBLY METHOD

(71) Applicants: Erick Merle Spory, Colorado Springs, CO (US); Timothy Mark Barry, Colorado Springs, CO (US)

(72) Inventors: Erick Merle Spory, Colorado Springs, CO (US); Timothy Mark Barry, Colorado Springs, CO (US)

(73) Assignee: Global Circuit Innovations, Inc., Colorado Springs, CO (US)

( * ) Notice: Subject to any disclaimer, the term of this patent is extended or adjusted under 35 U.S.C. 154(b) by 0 days.

(21) Appl. No.: 15/661,060

(22) Filed: Jul. 27, 2017

(65) Prior Publication Data

US 2018/0005910 A1   Jan. 4, 2018

Related U.S. Application Data

(60) Division of application No. 15/088,822, filed on Apr. 1, 2016, now Pat. No. 9,870,968, which is a
(Continued)

(51) Int. Cl.
*H01L 23/10* (2006.01)
*H01L 23/00* (2006.01)
(Continued)

(52) U.S. Cl.
CPC ............. *H01L 23/10* (2013.01); *H01L 22/14* (2013.01); *H01L 24/03* (2013.01); *H01L 24/06* (2013.01);
(Continued)

(58) Field of Classification Search
CPC ......... H01L 23/10; H01L 24/83; H01L 24/98; H01L 24/03
See application file for complete search history.

(56) References Cited

U.S. PATENT DOCUMENTS

| 4,012,832 A | 3/1977 | Crane |
| 4,426,769 A | 1/1984 | Grabbe |

(Continued)

FOREIGN PATENT DOCUMENTS

WO   WO2011-101272 A1   8/2011

OTHER PUBLICATIONS

Official Action for U.S. Appl. No. 15/792,414, dated Mar. 19, 2018.
(Continued)

*Primary Examiner* — Matthew L Reames
*Assistant Examiner* — Wilner Jean Baptiste
(74) *Attorney, Agent, or Firm* — Thomas J. Lavan

(57) ABSTRACT

A method is provided. The method includes one or more of extracting a die from an original packaged integrated circuit, modifying the extracted die, reconditioning the modified extracted die, placing the reconditioned die into a cavity of a hermetic package base, bonding a plurality of bond wires between reconditioned die pads of the reconditioned die to leads of the hermetic package base or downbonds to create an assembled hermetic package base, and sealing a hermetic package lid to the assembled hermetic package base to create a new packaged integrated circuit. Modifying the extracted die includes removing the one or more ball bonds on the one or more die pads. Reconditioning the modified extracted die includes adding a sequence of metallic layers to bare die pads of the modified extracted die. The extracted die is a fully functional semiconductor die with one or more ball bonds on one or more die pads of the extracted die.

20 Claims, 11 Drawing Sheets

Repackaged environmentally hardened integrated circuit

Related U.S. Application Data continuation-in-part of application No. 13/623,603, filed on Sep. 20, 2012, now abandoned, which is a continuation of application No. 13/283,293, filed on Oct. 27, 2011, now abandoned.

(51) Int. Cl.
*H01L 21/66* (2006.01)
*H01L 23/26* (2006.01)

(52) U.S. Cl.
CPC .............. *H01L 24/32* (2013.01); *H01L 24/49* (2013.01); *H01L 24/73* (2013.01); *H01L 24/83* (2013.01); *H01L 24/85* (2013.01); *H01L 24/92* (2013.01); *H01L 24/98* (2013.01); *H01L 23/26* (2013.01); *H01L 24/45* (2013.01); *H01L 24/48* (2013.01); *H01L 2224/03424* (2013.01); *H01L 2224/03464* (2013.01); *H01L 2224/0401* (2013.01); *H01L 2224/04042* (2013.01); *H01L 2224/05583* (2013.01); *H01L 2224/05624* (2013.01); *H01L 2224/05644* (2013.01); *H01L 2224/05655* (2013.01); *H01L 2224/05664* (2013.01); *H01L 2224/32225* (2013.01); *H01L 2224/45015* (2013.01); *H01L 2224/45124* (2013.01); *H01L 2224/45144* (2013.01); *H01L 2224/45147* (2013.01); *H01L 2224/48091* (2013.01); *H01L 2224/48227* (2013.01); *H01L 2224/48247* (2013.01); *H01L 2224/48463* (2013.01); *H01L 2224/73265* (2013.01); *H01L 2224/838* (2013.01); *H01L 2224/8501* (2013.01); *H01L 2224/85345* (2013.01); *H01L 2224/92247* (2013.01); *H01L 2924/00014* (2013.01); *H01L 2924/14* (2013.01); *H01L 2924/15153* (2013.01); *H01L 2924/2075* (2013.01)

(56) References Cited

U.S. PATENT DOCUMENTS

| | | | |
|---|---|---|---|
| 4,622,433 | A | 11/1986 | Frampton |
| 5,064,782 | A | 11/1991 | Nishiguchi |
| 5,219,794 | A | 6/1993 | Satoh |
| 5,243,756 | A | 9/1993 | Hamburgen et al. |
| 5,517,127 | A | 5/1996 | Bergeron |
| 5,598,031 | A | 1/1997 | Groover et al. |
| 5,783,464 | A | 7/1998 | Burns |
| 5,783,868 | A | 7/1998 | Galloway |
| 5,847,467 | A | 12/1998 | Wills |
| 5,936,758 | A | 8/1999 | Fisher et al. |
| 6,100,108 | A | 8/2000 | Mizuno et al. |
| 6,100,581 | A | 8/2000 | Wakefield et al. |
| 6,169,331 | B1 | 1/2001 | Manning |
| 6,429,028 | B1 | 8/2002 | Young |
| 6,472,725 | B1 | 10/2002 | Stroupe |
| 6,501,663 | B1 | 12/2002 | Pan |
| 7,067,332 | B1 | 6/2006 | Chowdhury |
| 7,160,368 | B1 | 1/2007 | Wakelin |
| 7,294,533 | B2 | 11/2007 | Lebonheur |
| 7,615,835 | B2* | 11/2009 | Takemasa ............... G01P 1/006 257/417 |
| 7,759,800 | B2 | 7/2010 | Rigg et al. |
| 7,833,880 | B2 | 11/2010 | Rizzi |
| 7,888,806 | B2 | 2/2011 | Lee et al. |
| 8,421,227 | B2 | 4/2013 | Lin |
| 8,518,746 | B2 | 8/2013 | Pagaila |
| 8,822,274 | B2 | 9/2014 | Suleiman |
| 9,799,617 | B1 | 10/2017 | Curiel et al. |
| 9,870,968 | B2 | 1/2018 | Spory |
| 2001/0019176 | A1 | 9/2001 | Ahiko et al. |
| 2002/0084528 | A1 | 7/2002 | Kim et al. |
| 2002/0182782 | A1 | 12/2002 | Farnworth |
| 2003/0127423 | A1 | 7/2003 | Dlugokecki |
| 2004/0006150 | A1 | 1/2004 | Murray et al. |
| 2004/0040855 | A1 | 3/2004 | Batinovich |
| 2004/0056072 | A1 | 3/2004 | Chapman et al. |
| 2005/0057883 | A1 | 3/2005 | Bolken |
| 2005/0085578 | A1 | 4/2005 | Iguchi |
| 2005/0285250 | A1 | 12/2005 | Jeong |
| 2006/0068595 | A1 | 3/2006 | Seliger et al. |
| 2006/0166406 | A1 | 7/2006 | Lin |
| 2007/0007661 | A1 | 1/2007 | Burgess |
| 2007/0259470 | A1 | 11/2007 | Quenzer et al. |
| 2007/0295456 | A1 | 12/2007 | Gudeman |
| 2008/0124547 | A1 | 5/2008 | O et al. |
| 2008/0197469 | A1 | 8/2008 | Yang et al. |
| 2008/0230922 | A1 | 9/2008 | Mochizuki |
| 2009/0072413 | A1 | 3/2009 | Mahler |
| 2009/0085181 | A1 | 4/2009 | Advincula, Jr. |
| 2009/0151972 | A1 | 6/2009 | Potter |
| 2009/0160047 | A1 | 6/2009 | Otsuka |
| 2010/0007367 | A1 | 1/2010 | Spielberger et al. |
| 2010/0079035 | A1 | 4/2010 | Matsuzawa et al. |
| 2010/0140811 | A1 | 6/2010 | Leal et al. |
| 2010/0200262 | A1 | 8/2010 | Mahapatra et al. |
| 2010/0246152 | A1 | 9/2010 | Lin et al. |
| 2010/0314754 | A1 | 12/2010 | Zhang |
| 2011/0068459 | A1* | 3/2011 | Pagaila ................. H01L 21/568 257/698 |
| 2011/0215449 | A1 | 9/2011 | Camacho et al. |
| 2011/0298137 | A1 | 12/2011 | Pagalia et al. |
| 2012/0061814 | A1 | 3/2012 | Camacho et al. |
| 2012/0177853 | A1 | 7/2012 | Gruenwald |
| 2012/0217643 | A1 | 8/2012 | Pagaila |
| 2013/0207248 | A1 | 8/2013 | Bensoussan et al. |
| 2014/0252584 | A1 | 9/2014 | Spory |
| 2016/0181168 | A1 | 6/2016 | Spory |
| 2016/0181171 | A1 | 6/2016 | Spory |
| 2016/0225686 | A1 | 8/2016 | Spory |
| 2016/0329305 | A1 | 11/2016 | Chiao |
| 2018/0040529 | A1 | 2/2018 | Spory |
| 2018/0047685 | A1 | 2/2018 | Spory |
| 2018/0047700 | A1 | 2/2018 | Spory |
| 2018/0053702 | A1 | 2/2018 | Spory |
| 2018/0061724 | A1 | 3/2018 | Spory |

OTHER PUBLICATIONS

Notice of Allowance for U.S. Appl. No. 15/792,414, dated May 14, 2018.
Official Action for U.S. Appl. No. 15/792,225, dated Apr. 30, 2018.
Official Action for U.S. Appl. No. 15/792,312, dated Apr. 19, 2018.
Official Action for U.S. Appl. No. 15/792,381, dated Apr. 16, 2018.
Wikipedia "3D Printing" reference, downloaded Jan. 12, 2015.
Wikipedia "Screen printing" reference, downloaded Jan. 12, 2015.
Official Action for U.S. Appl. No. 13/623,603, dated Dec. 9, 2014.
Official Action for U.S. Appl. No. 13/785,959, dated Jan. 5, 2015.
Official Action for U.S. Appl. No. 14/142,823, dated Jan. 5, 2015.
Getters—molecular scavengers for packaging, Dr. Ken Gilleo and Steve Corbett, HDI Jan. 2001, www.hdi-online.com, 4 pages.
Cookson Group Staydry SD1000 High Temperature Moisture Getter data sheet, Cookson Group, May 30, 2011, 1 page.
Wikipdia "Getter", retrieved May 30, 2011, http://en.wikipedia.org/wiki/Getter.
Wikipedia "Kirkendall effect", retrieved Jul. 5, 2011, http://en.wikipedia.org/wiki/Kirkendall effect.
Flip Chips dot com, Tutorial 72—Mar. 2007, Redistribution Layers, article by George A. Riley, PhD, Flipchips dot com website, downloaded Dec. 18, 2011: http://www.flipchips.com/tutorial72.html.
MIT article "Liquid Metal Printer Lays Electronic Circuits on Paper, Plastic, and even Cotton", downloaded from MIT Technology Review Nov. 22, 2013, http://www.technologyreview.com/view/521871/liquid-metal-printer-lays-electronic-circuits-on-paper-plastic-and-even-cotton/.
sPRO 125 and sPRO 250 Direct Metal SLM Production Printer datasheet, 3DSystems, Part No. 70743, Issue Date Apr. 10, 2012.
Wikipedia "Ball Bonding", downloaded Apr. 11, 2016.

(56) References Cited

OTHER PUBLICATIONS

Solid State Technology "The back-end process: Step 7—Solder bumping step by step", by Deborah S. Patterson, http://electroiq.com/blog/2001/07/the-back-end-process-step-7-solder-bumping-step-by-step/, downloaded Apr. 11, 2016.
Official Action for U.S. Appl. No. 13/623,603, dated Apr. 16, 2015.
Official Action for U.S. Appl. No. 13/623,603, dated Aug. 14, 2015.
Official Action for U.S. Appl. No. 13/623,603, dated Apr. 29, 2016.
Official Action for U.S. Appl. No. 13/785,959, dated Apr. 16, 2015.
Official Action for U.S. Appl. No. 14/142,823, dated May 11, 2015.
Official Action for U.S. Appl. No. 14/142,823, dated Oct. 9, 2015.
Official Action for U.S. Appl. No. 14/142,823, dated Feb. 29, 2016.
Official Action for U.S. Appl. No. 14/565,626, dated Aug. 28, 2015.
Official Action for U.S. Appl. No. 14/600,691, dated Aug. 10, 2015.
Official Action for U.S. Appl. No. 14/600,691, dated Feb. 19, 2016.
Official Action for U.S. Appl. No. 14/600,733, dated Apr. 17, 2015.
Official Action for U.S. Appl. No. 14/600,733, dated Sep. 9, 2015.
Official Action for U.S. Appl. No. 14/600,733, dated May 9, 2016.
Official Action for U.S. Appl. No. 13/623,603, dated Aug. 24, 2016.
Official Action for U.S. Appl. No. 13/623,603, dated Apr. 11, 2017.
Official Action for U.S. Appl. No. 14/142,823, dated Jul. 28, 2016.
Official Action for U.S. Appl. No. 14/142,823, dated Mar. 17, 2017.
Official Action for U.S. Appl. No. 14/600,691, dated Jul. 29, 2016.
Official Action for U.S. Appl. No. 14/600,691, dated Dec. 27, 2016.
Notice of Allowance for U.S. Appl. No. 14/600,691, dated Jun. 6, 2017.
Official Action for U.S. Appl. No. 14/600,733, dated Aug. 23, 2016.
Official Action for U.S. Appl. No. 14/600,733, dated Dec. 2, 2016.
Official Action for U.S. Appl. No. 15/088,822, dated Mar. 24, 2017.
Official Action for U.S. Appl. No. 13/623,603, dated Jan. 16, 2018.
Notice of Allowance for U.S. Appl. No. 14/142,823, dated Nov. 30, 2017.
Notice of Allowance for U.S. Appl. No. 14/142,823, dated Feb. 16, 2018.
Notice of Allowance for U.S. Appl. No. 15/088,822, dated Nov. 13, 2017.
Notice of Allowance for U.S. Appl. No. 14/600,733, dated Oct. 5, 2017.
Notice of Allowance for U.S. Appl. No. 15/088,822, dated Aug. 15, 2017.
Notice of Allowance for U.S. Appl. No. 15/792,225, dated Sep. 24, 2018.
Notice of Allowance for U.S. Appl. No. 15/792,312, dated Sep. 18, 2018.
Official Action for U.S. Appl. No. 15/792,381, dated Aug. 9, 2018.

* cited by examiner

FIG. 1  *Extracted die with bond pads and ball bonds*
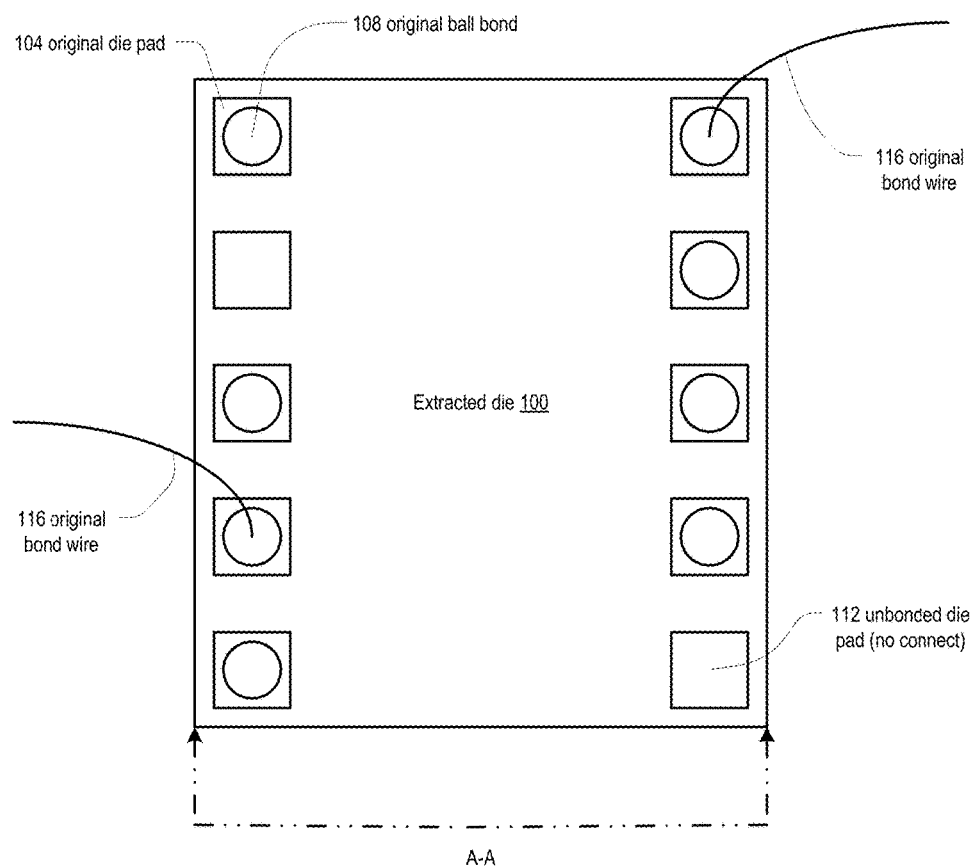

FIG. 2A  Extracted die installed in hermetic package base
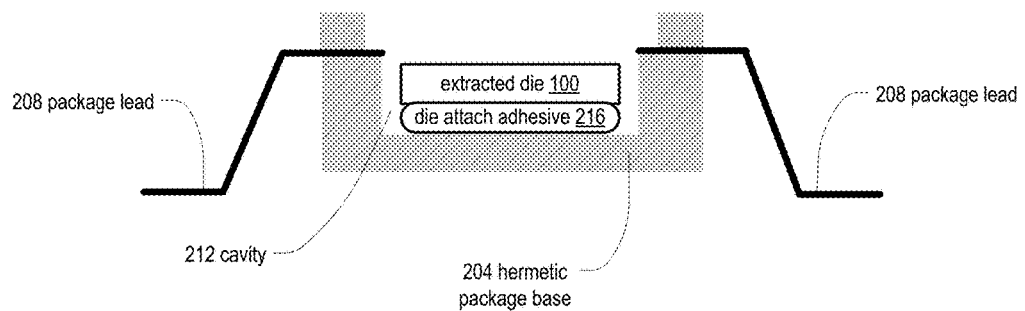
FIG. 2B  Extracted die rebonded to a hermetic package base
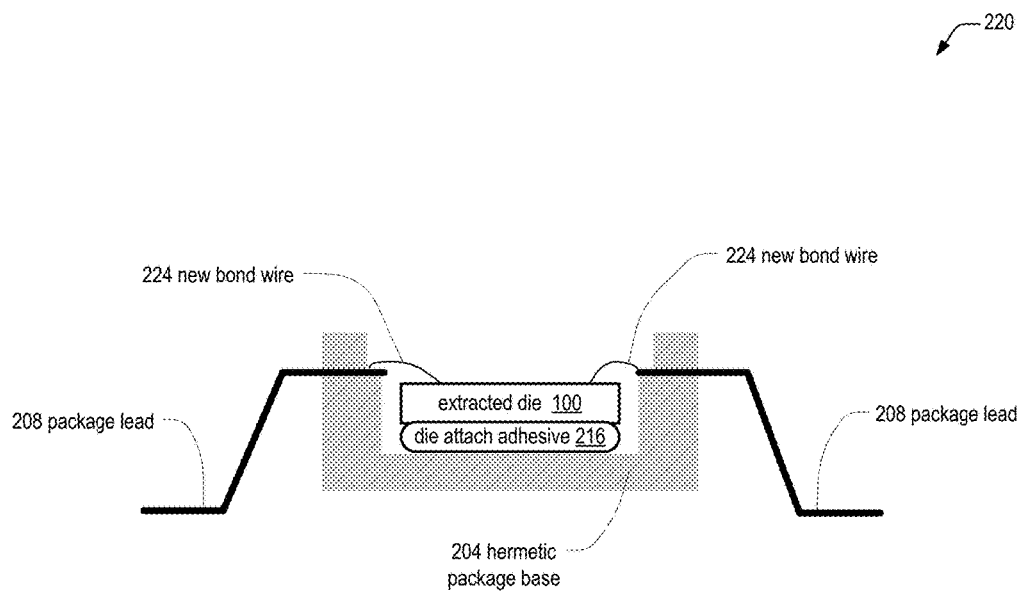

FIG. 2C Repackaged environmentally hardened integrated circuit
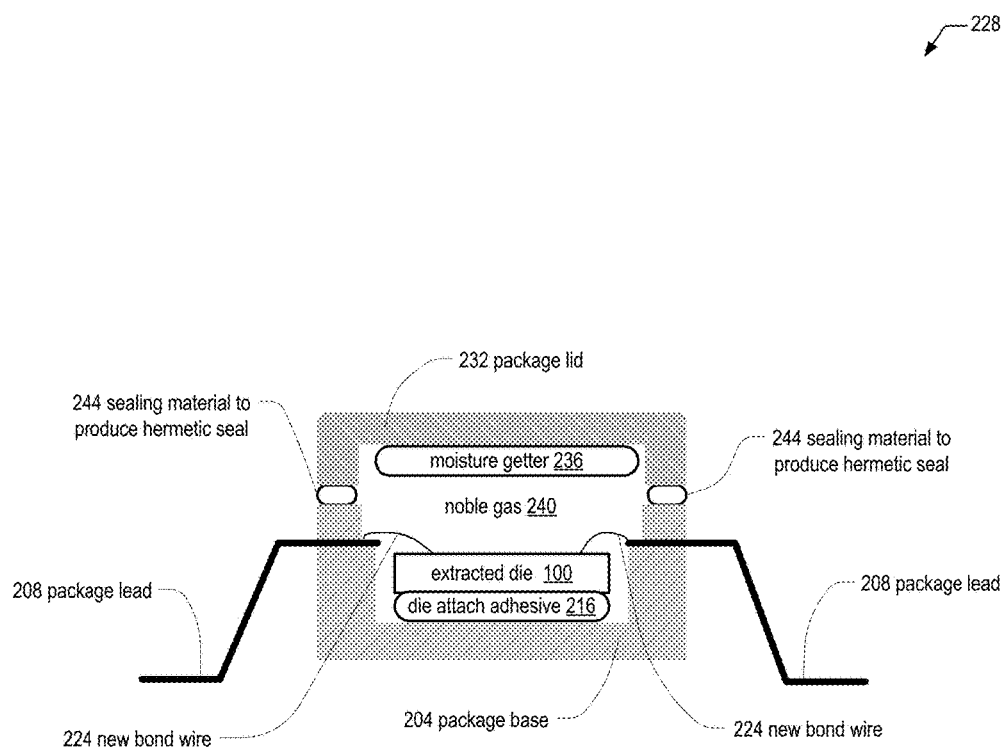

FIG. 3A Extracted die section A-A
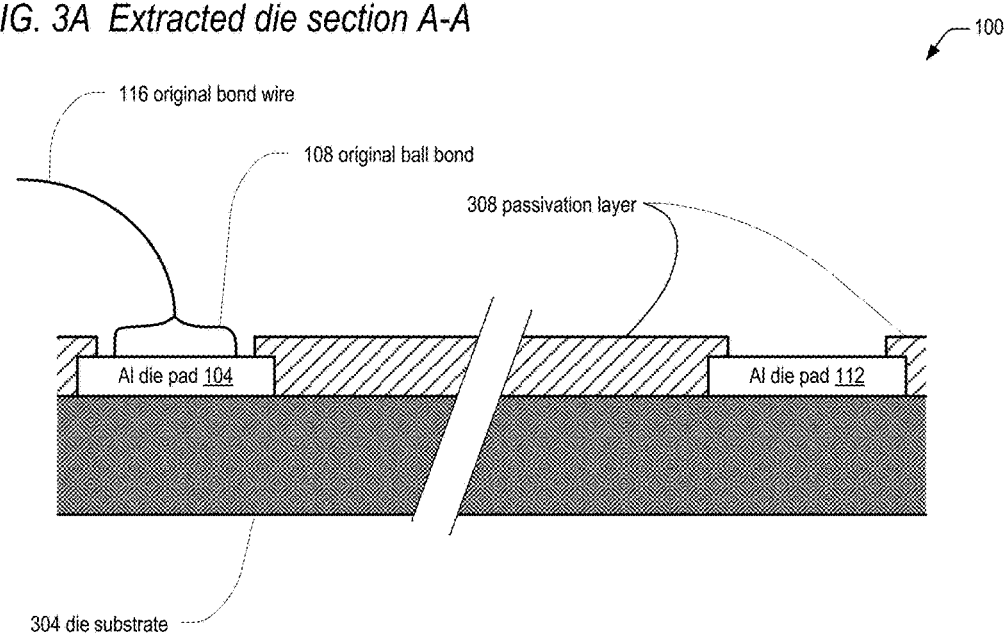
FIG. 3B Modified extracted die section A-A after original ball bond and original bond wire removal
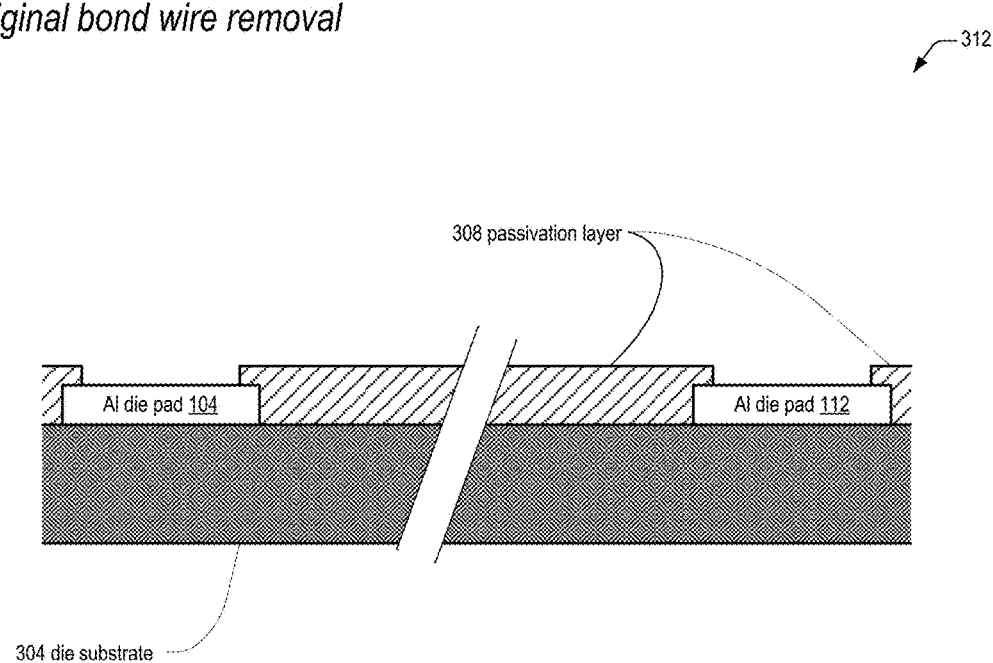

*FIG. 3C Electroless Nickel layer application section A-A*
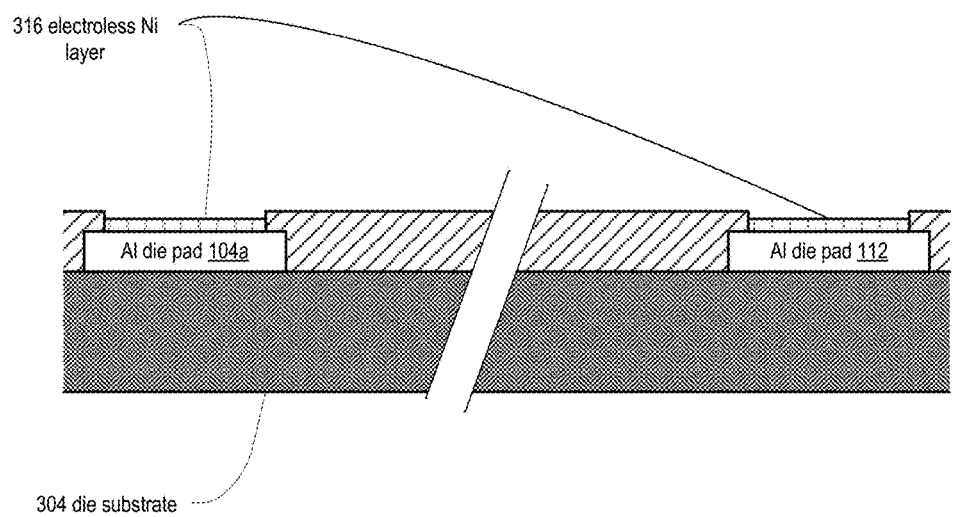
*FIG. 3D Electroless Palladium layer section A-A*
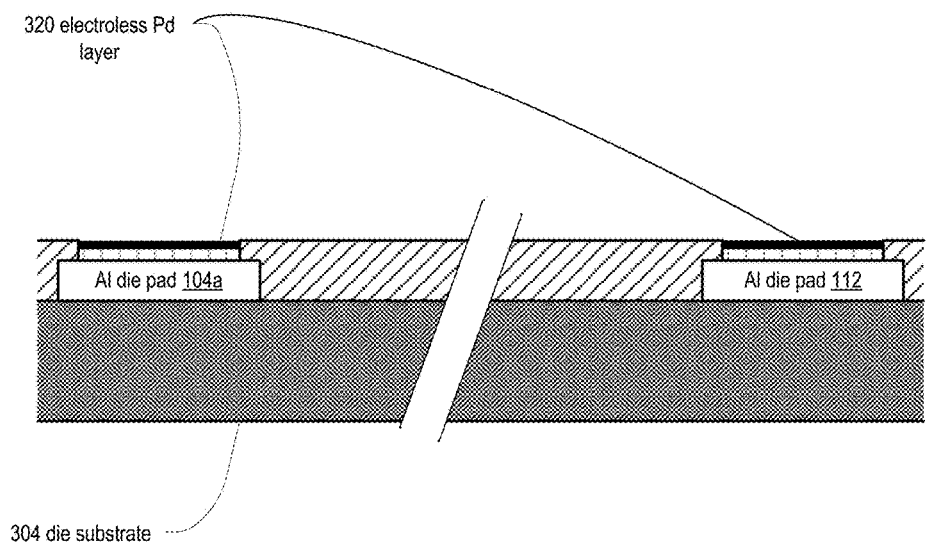

FIG. 3E  Immersion Gold layer application section A-A
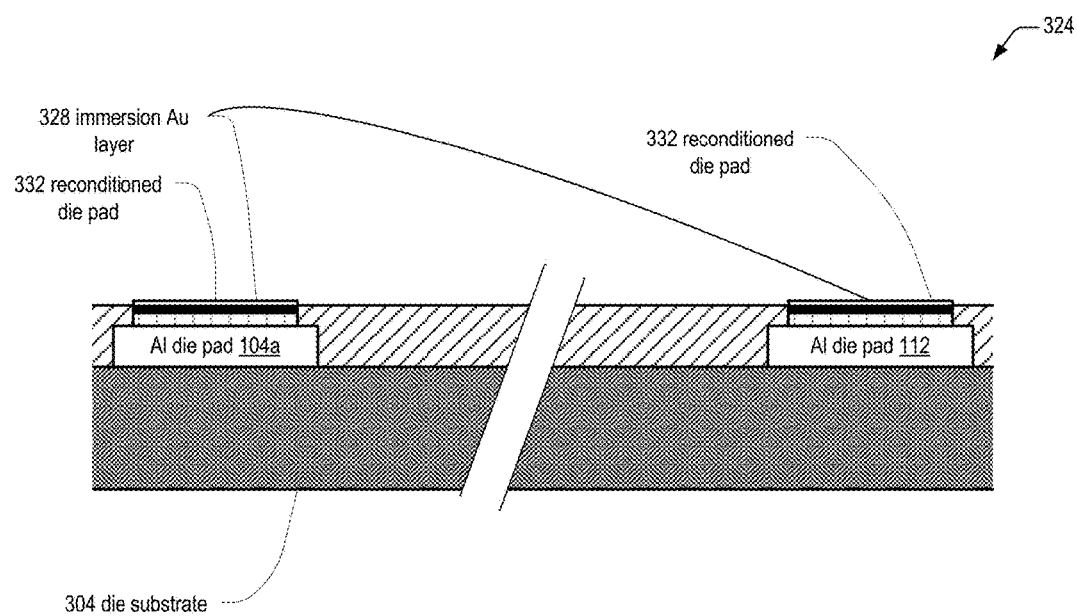
FIG. 3F  New bond wire and ball bonds section A-A
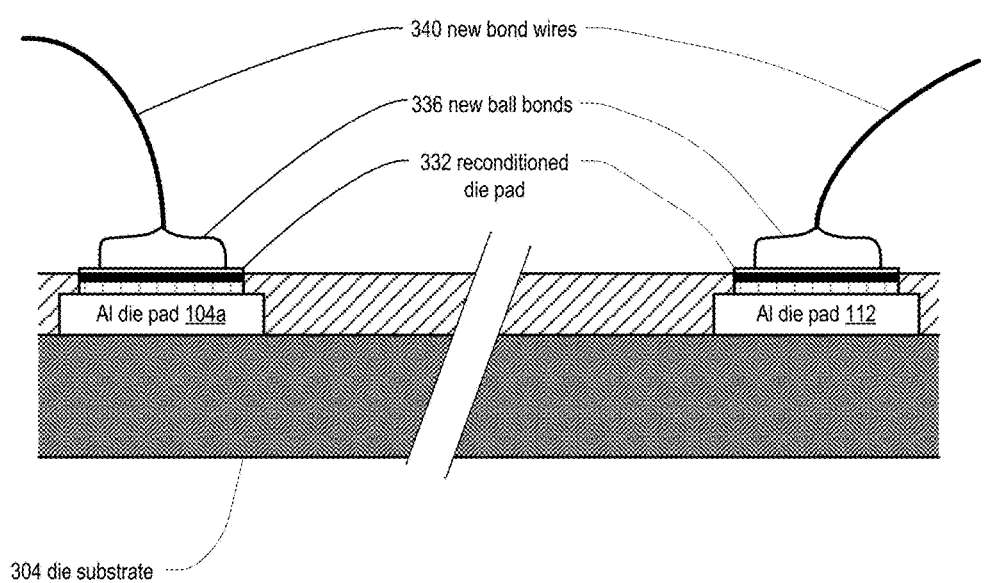

FIG. 4A  Reconditioned die installed in hermetic package base
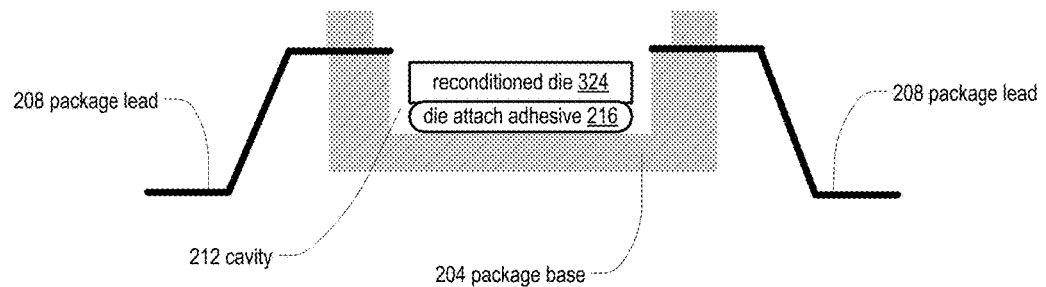
FIG. 4B  Reconditioned die rebonded to package base
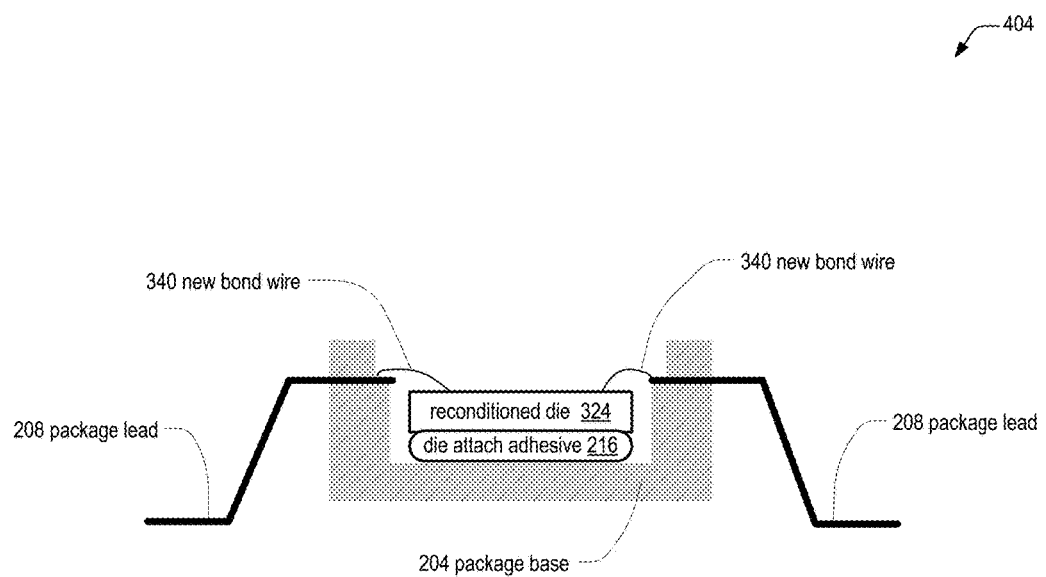

FIG. 4C  Repackaged environmentally hardened integrated circuit
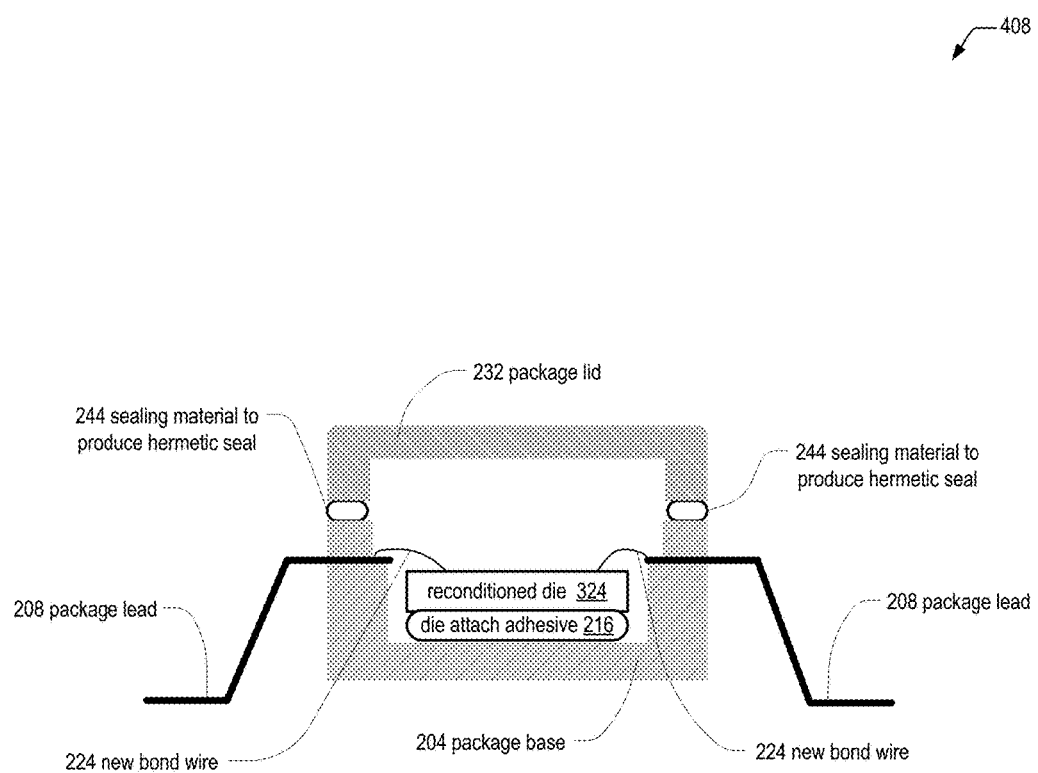

FIG. 5A  Reconditioning method for extracted die
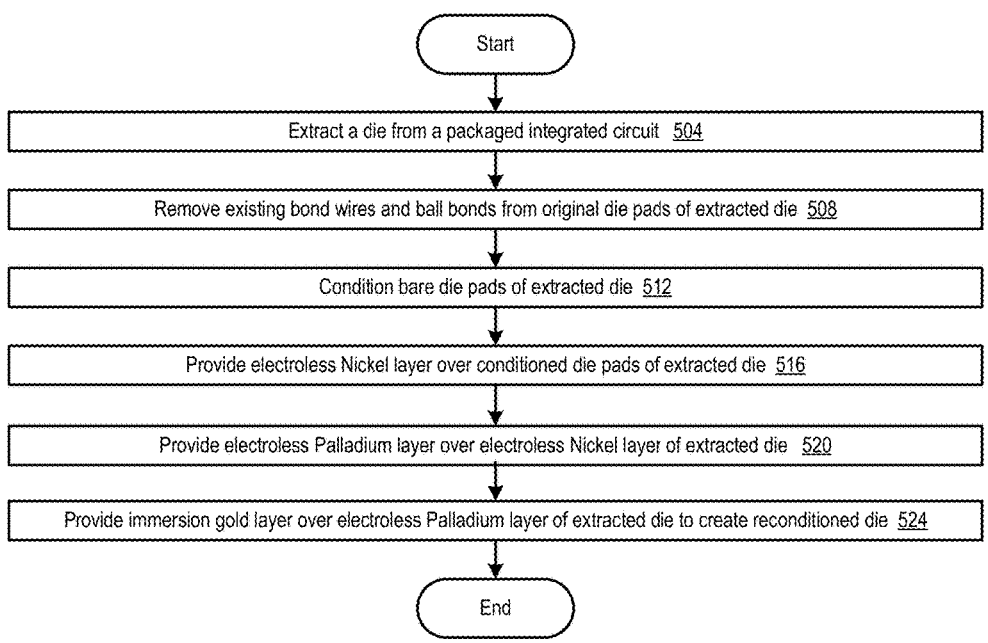

FIG. 5B Reconditioning method for extracted die
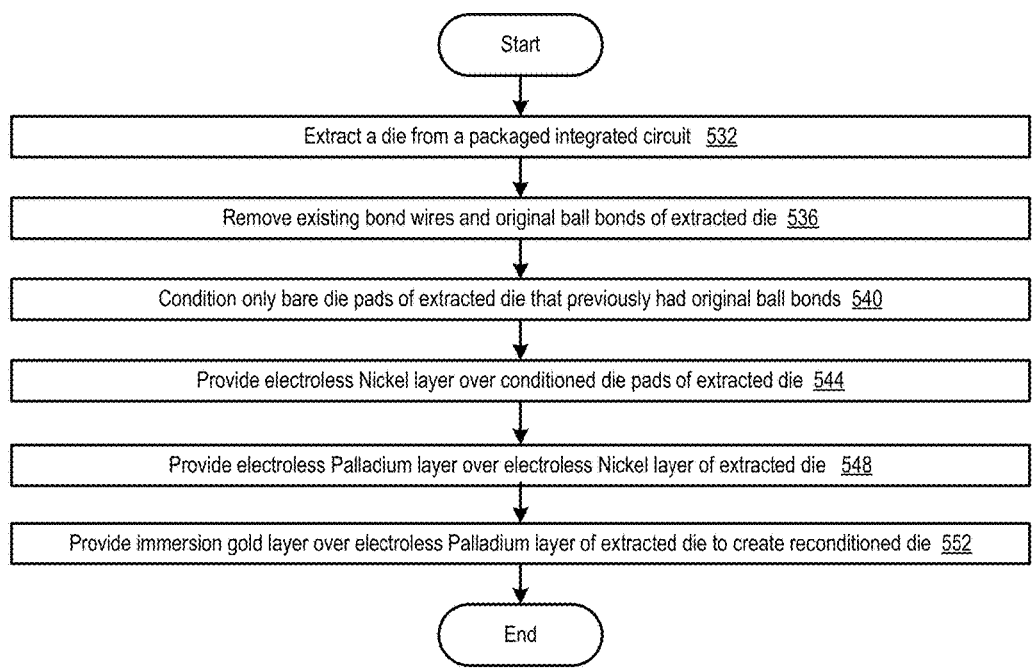

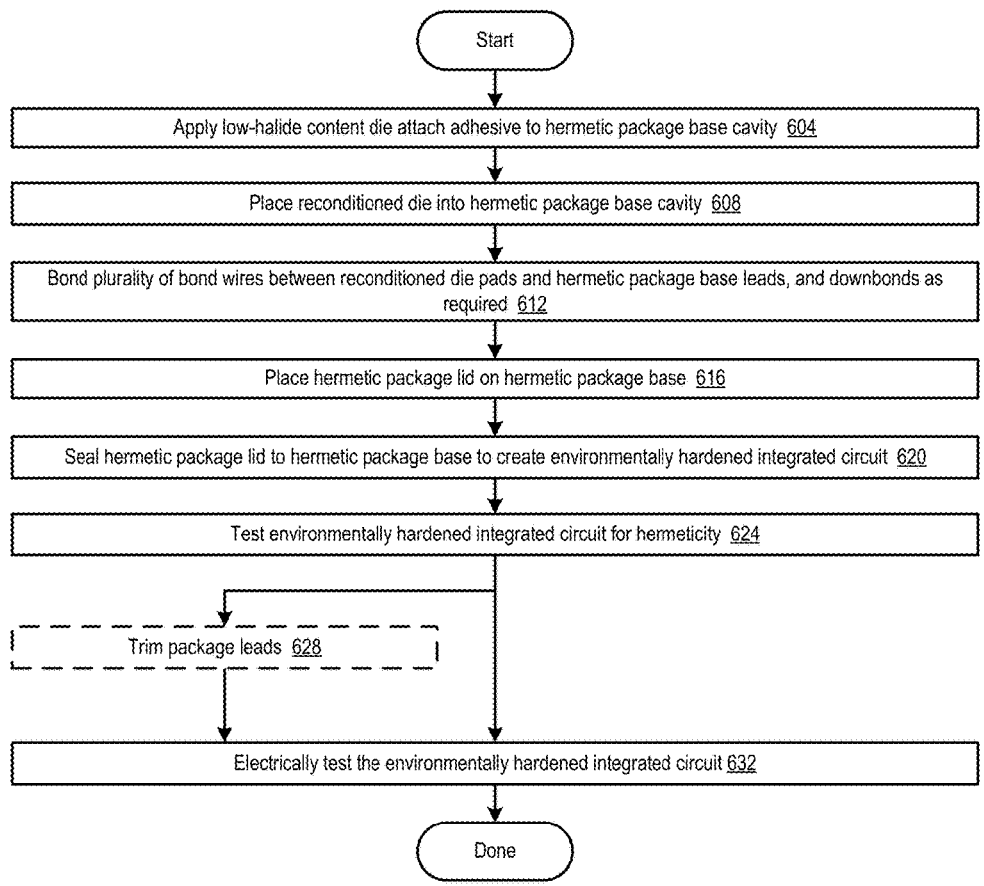
FIG. 6 Assembly method for repackaged environmentally hardened integrated circuit

REPACKAGED INTEGRATED CIRCUIT ASSEMBLY METHOD

CROSS REFERENCE TO RELATED APPLICATION(S)

This application is a Divisional of pending non-Provisional U.S. application Ser. No. 15/088,822 filed Apr. 1, 2016, entitled REPACKAGED INTEGRATED CIRCUIT AND ASSEMBLY METHOD, which is hereby incorporated by reference for all purposes, which is a Continuation-in-Part of U.S. application Ser. No. 13/623,603 filed Sep. 20, 2012, entitled ENVIRONMENTAL HARDENING TO EXTEND OPERATING LIFETIMES OF INTEGRATED CIRCUITS AT ELEVATED TEMPERATURES, which is a Continuation of U.S. application Ser. No. 13/283,293 filed Oct. 27, 2011, entitled ENVIRONMENTAL HARDENING TO EXTEND OPERATING LIFETIMES OF INTEGRATED CIRCUITS AT ELEVATED TEMPERATURES, now abandoned.

FIELD

The present invention is directed to integrated circuit packaging. In particular, the present invention is directed to methods for repackaging integrated circuits capable of operating at extended temperatures over extended lifetimes.

BACKGROUND

Integrated circuits are available in many different packages, technologies, and sizes. Most integrated circuits are available in plastic packages, which are generally intended for commercial operating environments at a low cost. Commercial operating environments have a specified operating range from 0° C. to 70° C. Integrated circuits for military applications have historically been packaged in either metal or ceramic hermetic packages, which are able to work reliably in more demanding environments than commercial integrated circuits. Military operating environments have a specified operating range from −55° C. to 125° C. In order to save costs, the military has purchased integrated circuits through COTS (Commercial Off-The-Shelf) programs. However, these components are generally commercial grade components in plastic packages, and not intended for demanding environments requiring the broader temperature range reliability and durability of ceramic and metal hermetically packaged integrated circuits.

Depending on size and complexity, integrated circuits are available in a wide range of packages. Although many older integrated circuits were packaged using through-hole technology packages, surface mount packages have dominated over the past several decades. Surface mount packages generally have circuit density, cost, and other advantages over through-hole integrated circuits. Examples of through-hole packages include DIP (dual-in-line plastic) and PGA (pin grid array). Examples of surface mount packages include SOIC (small-outline integrated circuit) and PLCC (plastic leaded chip carrier).

In many cases, products requiring integrated circuits are in production or service for a longer time period than the manufacturing lifetime of a given integrated circuit. In such cases, it is not uncommon for parts to become obsolete or become unable to be purchased. For example, in a typical month, about 3% of all packaged integrated circuit product types become obsolete. One mitigating approach to this issue is to buy a sufficient lifetime inventory of spares for integrated circuits that are likely to become obsolete at a future date. However, this may be costly if a large quantity of integrated circuits needs to be purchased as spares. It also may result in far more spares being purchased that are actually required, since projected future needs may only be a rough estimate. When spares are needed in the future when an IC is no longer in active production, the ICs that are actually available may be in a different package than is required, since popular ICs are typically offered in multiple package options. For example, spares may be available in plastic DIP packages while the using assemblies require SOIC packages.

SUMMARY

The present invention is directed to solving disadvantages of the prior art. In accordance with embodiments of the present invention, a method is provided. The method includes one or more of extracting a die from an original packaged integrated circuit, modifying the extracted die, reconditioning the modified extracted die, placing the reconditioned die into a cavity of a hermetic package base, bonding a plurality of bond wires between reconditioned die pads of the reconditioned die to leads of the hermetic package base or downbonds to create an assembled hermetic package base, and sealing a hermetic package lid to the assembled hermetic package base to create a new packaged integrated circuit. Modifying the extracted die includes removing the one or more ball bonds on the one or more die pads. Reconditioning the modified extracted die includes adding a sequence of metallic layers to bare die pads of the modified extracted die. The extracted die is a fully functional semiconductor die with one or more ball bonds on one or more die pads of the extracted die In accordance with another embodiment of the present invention, a method is provided. The method includes one or more of extracting a die from an original packaged integrated circuit, modifying the extracted die, reconditioning the modified extracted die, placing the reconditioned die into a hermetic package including package leads, the hermetic package configured to enclose the reconditioned die, and bonding a plurality of bond wires between reconditioned die pads of the reconditioned die to the package leads or downbonds. Modifying the extracted die includes removing the one or more ball bonds from the one or more die pads. Reconditioning the modified extracted die includes adding a sequence of nickel, palladium, and gold metallic layers to bare die pads of the modified extracted die. The extracted die is a fully functional semiconductor die with one or more ball bonds on one or more die pads of the extracted die.

An advantage of the present invention is that it provides improved assembly methods for a packaged integrated circuit that works reliably at extended ambient temperatures. Packaged integrated circuits of the conventional art require components and assembly steps that take longer and add cost relative to the present invention. Therefore, the former methods are less suitable for volume production.

Yet another advantage of the present invention is it provides methods for assembling high temperature-tolerant packaged integrated circuits without requiring new bare dice. Often, new bare dice are not available due to integrated circuit obsolescence, the original manufacturer or foundry is out of production, or the dice manufacturer is only selling packaged integrated circuits. By using extracted dice as the source, as long as the dice are available in some package, they may then be re-used in high-temperature hermetic packages.

One additional advantage of the present invention is that it allows an existing component to be repackaged into virtually any possible hermetic package and reused. Sometimes, the only available components are packaged in commercial plastic packages, but the using application requires a specific different hermetic package. As long as the specific different hermetic package is available, the die in the original commercial package may be repackaged in the specific different hermetic package.

Additional features and advantages of embodiments of the present invention will become more readily apparent from the following description, particularly when taken together with the accompanying drawings.

BRIEF DESCRIPTION OF THE DRAWINGS

FIG. 1 is a diagram illustrating an extracted die with bond pads and ball bonds in accordance with embodiments of the present invention.

FIG. 2A is a diagram illustrating an extracted die installed in a package base in accordance with the present invention.

FIG. 2B is a diagram illustrating an extracted die rebonded to a package base in accordance with the present invention.

FIG. 2C is a diagram illustrating a repackaged environmentally hardened integrated circuit in accordance with the present invention.

FIG. 3A is a diagram illustrating a section A-A of an extracted die in accordance with embodiments of the present invention.

FIG. 3B is a diagram illustrating a section A-A of a modified extracted die after original ball bond and original bond wire removal in accordance with embodiments of the present invention.

FIG. 3C is a diagram illustrating a section A-A of electroless nickel layer application in accordance with embodiments of the present invention.

FIG. 3D is a diagram illustrating a section A-A of electroless palladium layer application in accordance with embodiments the present invention.

FIG. 3E is a diagram illustrating a section A-A of immersion gold layer application in accordance with embodiments the present invention.

FIG. 3F is a diagram illustrating a section A-A of new bond wire and ball bonds in accordance with embodiments the present invention.

FIG. 4A is a diagram illustrating a reconditioned die installed in a package base in accordance with the preferred embodiment of the present invention.

FIG. 4B is a diagram illustrating a reconditioned die rebonded to a package base in accordance with the preferred embodiment of the present invention.

FIG. 4C is a diagram illustrating a repackaged environmentally hardened integrated circuit in accordance with the preferred embodiment of the present invention.

FIG. 5A is a flowchart illustrating a reconditioning method for an extracted die in accordance with a first embodiment of the present invention.

FIG. 5B is a flowchart illustrating a reconditioning method for an extracted die in accordance with a second embodiment of the present invention.

FIG. 6 is a flowchart illustrating an assembly method for a repackaged environmentally hardened integrated circuit in accordance with the preferred embodiment of the present invention.

DETAILED DESCRIPTION

Many operating environments require integrated circuit components capable of operating reliably at extended temperatures. Some of these environments include engine controls, down-hole drilling, and foundry manufacturing operations. Engine controls are often located in close proximity to an internal combustion, gas turbine, or jet engine, and are sometimes located on the engine side of a firewall. Down-hole drilling requires a wide variety of sensors, control components, and communication components operating in close proximity to a drill. In addition to heat generated by the drill itself, drilling far below the Earth's crust can reach operating environment temperatures of greater than 200° C. due to geothermal heat. Foundry operations require sensors and control components operating in close proximity to molten metal.

Although military grade integrated circuits are often desirable for extended high temperature environments, in many cases the environments themselves experience higher temperatures than the military grade integrated circuit temperature rating. For example, down-hole drilling environments sometimes reach temperatures of 250° C., while military-grade integrated circuits commonly have a −55° C. to 125° C. operating temperature range. Another problem is the required integrated circuits may not be available in packages that can reliably withstand these temperature extremes. Required integrated circuits are sometimes out of production, and it is typically prohibitively expensive to procure new integrated circuits in suitable packaging. Therefore, what is needed is a method for modifying existing integrated circuits in order to work reliably at extended temperature operating environments.

Integrated circuits are most commonly packaged using dice with Aluminum (Al) bond pads and Gold (Au) bond wires from the bond pads to the package leads and package cavity. Since bare dice are generally not available, it is highly desirable to obtain dice from already packaged integrated circuits. Integrated circuit dice are then extracted from an existing package—usually plastic—and repackaged into a suitable hermetic package according to the methods of the present invention. These extracted dice retain the original Au ball bonds on the Al die pads.

Several known failure mechanisms exist with Au—Al metallic interfaces. A brief overview is discussed in Wikipedias "Gold-aluminum intermetallic", which can be found at: http://en.wikipedia.org/wiki/Gold-aluminium_intermetallic. A more in-depth discussion of Gold (Au)-Aluminum (Al) intermetallics can be found in "Wire Bonding in Microelectronics", Third Edition, by George Harman—published in 2010 by McGraw-Hill, ISBN P/N 978-0-07-170101-3 and CD P/N 978-0-07-170334-5 of set 978-0-07-147623-2. Specifically, the Harman reference discusses Au—Al intermetallic compounds in Chapter 5 pages 131-153, thermal degradation in Au ball bonds on Al bond pads in Appendix 5B pages 170-173, and wire bonds in extreme temperature environments in Chapter 9 pages 330-335.

Approximately 95% of all integrated circuits utilize Au ball bonds on Al bond pads, are plastic encapsulated and, are subjected to high temperatures in the resin curing process. There are five Au—Al intermetallic compounds: $Au_5Al_2$, $Au_4Al$, $Au_2Al$, $AuAl_2$, and $AuAl$. Gold-Aluminum intermetallic compound formation and associated Kirkendall voids have resulted in more documented wire-bond failures than any other integrated circuit problem over the years. The $AuAl_2$ intermetallic compounds are typically referred to as "purple plague", reflecting the characteristic color that often occurs around the perimeter of an Au bond on an Al pad. The compounds grow during the curing of plastic molding compounds (typically 175° C. for 3 to 5 hours) and grow during qualification screening, burn in, stabilization bakes, or cumulatively at any time when high temperatures (above 150° C.) are encountered during the life of the device.

Bond failures result from the formation of Kirkendall voids, as well as from the susceptibility of Au—Al couples to the degradation by impurities or corrosion. Kirkendall voids form when either the Al or Au diffuses out of one region faster than it diffuses in from the other side of that region. Vacancies pile up and condense to form voids, normally on the Au-rich side. Classical Kirkendall voids require bake times greater than an hour at temperatures greater than 300° C. to occur on the Au-rich side and greater than 400° C. on the Al-rich side, or much longer times of lower temperatures. However, the failures resulting from impurities, poor welding, hydrogen, or other defects in plated Au layers can appear to have resulted from Kirkendall voiding. It has been observed that Kirkendall voids may form more quickly over time at elevated temperatures in packaged integrated circuits in the presence of impurities, halides, and/or moisture around the Au—Al bonds. Halides present in plastic packages contribute to significantly faster formation of Kirkendall voids relative to that of hermetic packages. In plastic packages, moisture will easily travel through the plastic package and reach the die surface, mixing with present halides and causing the IC to prematurely fail. Therefore, what is needed is a process to repackage integrated circuits in such a way as to discourage the formation of Kirkendall voids and other forms of intermetallic bond weakness at elevated temperatures.

From this discussion, it can be seen that it is desirable to avoid Au—Al bonds, especially when the packaged integrated circuit incorporating these bonds is exposed to extreme environmental conditions incorporating high temperatures, high temperature gradients, and high levels of shock and vibration.

The ENEPIG surface finish (Electroless Nickel/Electroless Palladium/Immersion Gold) originated in the mid-1990s as a modification of the more conventional ENIG finish (Electroless Nickel//Immersion Gold). During development of ENEPIG, it was recognized that the addition of a Palladium (Pd) layer between the nickel (Ni) and the gold (Au) enabled both gold and aluminum (Al) wire bonding operations, in addition to the normal soldering application. In addition, the Pd layer was found to limit the corrosion of the nickel by an overly aggressive immersion gold application process. An electrolytic nickel/gold finish was typically the process of record for integrated circuit gold wire bonding applications.

As a surface finish, ENEPIG has received increased attention for gold wire bonding operations. With a lower gold thickness compared to ENIG processes, ENEPIG exhibits improved reliability, better performance, and reduced cost.

The present invention is directed to the problem of repackaging integrated circuit dice into hermetic packages able to work reliably at high temperature extremes. Once a die has been extracted from an existing integrated circuit package (also described herein as a finished packaged integrated circuit or a different packaged integrated circuit), gold ball bonds still remain on the die bond pads. In some embodiments, new bond wires are bonded between the existing balls of the extracted die and package leads and the package cavity of the new package. The new package may be the same type of package the die was extracted from, or it may be an entirely different type of integrated circuit package. However, in all cases the new package must be able to be hermetically sealed for optimum lifetime at elevated temperatures. A hermetically sealed integrated circuit is an airtight and moisture-tight integrated circuit. Integrated circuit hermeticity is specified in MIL-SPEC-883H "Department of Defense Test Method Standards Microcircuits" test method 1014.13. Hermetically sealed packages in current technology require a ceramic or metal lid and base. However, it is possible in the future that hermetically sealed packages may use a lid and base fabricated from a material other than ceramic or metal, and the present invention therefore applies to any hermetic package material.

Referring now to FIG. 1, a diagram illustrating an extracted die 100 with bond pads and ball bonds in accordance with embodiments of the present invention is shown. In most embodiments, extracted die 100 is an individual semiconductor die or substrate, and is usually fabricated in suitable technologies including Silicon (Si) and Gallium Arsenide (GaAs). Extracted die 100 may have a single die or multiple interconnected dice. Regardless whether extracted die 100 includes a single die or multiple interconnected dice, die circuitry is connected to individual die pads 104, 112 of the extracted die 100. Die pads 104 are aluminum (Al) or copper (Cu) alloy pads. Each previously used die pad 104 of the extracted die 100 has an original gold ball bond 108 present, and possibly an associated original bond wire 116. When the extracted die 100 was present in whatever previous package was used for the extracted die 100, original bond wires 116 connected each of the original gold ball bonds 108 to a lead or a downbond of the previous package. FIG. 1 illustrates the extracted die 100, after it has been removed from the previous package. Therefore, some original bond wires 116 have been removed and only original gold ball bonds 108 and two original bond wires 116 remain. Depending on the specific extracted die 100, one or more unbonded die pads 112 may be present—where no original ball bond 108 and original bond wire 116 previously existed. Unbonded die pads 112 generally indicate a no connect to the previous package leads, and may or may not be connected to other circuitry of the extracted die 100. Section A-A provides a reference to an end-on view for other drawings to illustrate the construction and methods of the present invention.

Referring now to FIG. 2A, a diagram illustrating an extracted die 100 installed in a hermetic package base 204 in accordance with the present invention is shown. The hermetic package base 204 may be formed from ceramic, metal, or glass materials. The hermetic package base 204 includes a cavity 212 into which an extracted die 100 is placed.

Die attach adhesive 216 is applied to the hermetic package base 204 such that when the extracted die 100 is inserted into the hermetic package base cavity 212, the die attach adhesive 216 makes simultaneous contact with both the interior of the hermetic package base 204 and the bottom surface of the extracted die 100. Die attach adhesive 216 is a low-halide compound adhesive, where a low halide compound has less than 10 parts per million (ppm) halide. Die attach adhesive 216 therefore bonds the extracted die 100 to the hermetic package base 204, and protects the integrity of the interior of the repackaged environmentally hardened integrated circuit. It has been well established that halogens in an Au—Al bond interface degrade Au—Al bond strength since out gassed products from adhesives containing halogens rapidly corrode Al metallization in integrated circuits at high temperatures, thus reducing product lifetime.

Associated with the hermetic package base 204 are a series of package leads 208, which provide interconnection between circuitry of the extracted die 100 and circuitry of a printed circuit board on which the repackaged environmentally hardened integrated circuit is eventually mounted. For example, if an S0-24 ceramic package is used for the repackaged environmentally hardened integrated circuit, 24 package leads 208 would be present, configured as 12 package leads 208 on each of two opposite sides of the hermetic package base 204. If a PLCC-68 ceramic package is used for the repackaged environmentally hardened integrated circuit, 68 package leads 208 would be present, configured as 17 package leads 208 on each of the four sides of the hermetic package base 204.

Referring now to FIG. 2B, a diagram illustrating an extracted die 100 rebonded to a hermetic package base 204 in accordance with the present invention is shown. One the rebonding is completed, the result is an assembled hermetic package base 220. After mounting the extracted die 100 into the hermetic package base 204 using die attach adhesive 216, bond wires 224 are then attached by thermosonic welding from original gold ball bonds 108 of extracted die 100 to package leads 208. Thermosonic welding utilizes ultrasonic and thermal energy to provide strong bonds between bond wires 224 and die pads 104/package leads 208. Bond wires 224 are commonly 1-3 mils in diameter, but may be any usable diameter. In a preferred embodiment, bond wires 224 are Gold (Au) bond wires 224. In other embodiments, bond wires 224 are Aluminum (Al) or Copper (Cu) bond wires 224.

Once all new bond wires 224 are bonded between package leads 208 and original gold ball bonds 108 or downbonds to the package cavity 212, the assembled hermetic package base 220 including extracted die 100, die attach adhesive 216, hermetic package base 204, package leads 208, and new bond wires 224 is first vacuum baked according to the processes disclosed in related application Ser. No. 13/623,603. The assembled hermetic package base 220 is an intermediate assembly of the repackaged environmentally hardened integrated circuit 228 illustrated in FIG. 2c.

Referring now to FIG. 2C, a diagram illustrating a repackaged environmentally hardened integrated circuit 228 in accordance with the present invention is shown. Repackaged environmentally hardened integrated circuit 228 includes the assembled hermetic package base 220 of FIG. 2b and additional components described below.

Following the first vacuum baking process of application Ser. No. 13/623,603, a hermetic package lid 232 is attached to the assembled hermetic package base 220. The hermetic package lid 232 may be formed from ceramic, metal, or glass materials.

A moisture getter 236 is present within the repackaged environmentally hardened integrated circuit 228. The moisture getter 236 is a compound that absorbs moisture within the repackaged environmentally hardened integrated circuit 228 after the package has been hermetically sealed. By absorbing moisture that rapidly weakens Au—Al bonds at temperatures over 175° C., the predominant high temperature failure mechanism is minimized within the repackaged environmentally hardened integrated circuit 228. An example of a moisture getter 236 is Cookson Group STAY-DRY® SD1000, which is a paste formulation high-temperature moisture getter 236 intended for high reliability applications. In a preferred embodiment, moisture getter 236 is applied to the interior surface of the hermetic package lid 232 using a deposition process, where uniform thickness of three or more microns of moisture getter 236 is applied.

A sealing material 244 is present between the hermetic package base 204 and the hermetic package lid 232 to produce a hermetic seal at the end of a second vacuum bake process. The second vacuum bake process is illustrated and further described in application Ser. No. 13/623,603 as well. In a preferred embodiment, sealing material 244 is applied to the hermetic package lid 232 prior to attaching the hermetic package lid 232 to the assembled hermetic package base 220. In one embodiment, the sealing material 244 is sealing glass. In another embodiment, the sealing material 244 is an epoxy. In a third embodiment, the sealing material 244 is a solder compound.

In conjunction with the second vacuum bake process, a noble gas 240 is injected into the interior of the repackaged environmentally hardened integrated circuit 228. Noble gas 240 injection occurs prior to sealing the hermetic package lid 232 to the assembled hermetic package base 220, but during the second vacuum bake process. In a preferred embodiment, the noble gas 240 is Argon. In other embodiments, noble gas 240 includes any one of Helium (He), Neon (Ne), Krypton (Kr), Xenon (Xe), and Radon (Rn). Noble gases 240 pressurize the repackaged environmentally hardened integrated circuit 228 such that over temperatures of −55° C. to 250° C., the internal pressure of the repackaged environmentally hardened integrated circuit 228 is maintained between 0.1 ATM and 2 ATM, preferably 1 ATM. This minimizes pressure-caused stress to the repackaged environmentally hardened integrated circuit 228, and especially stress to the sealing material 244. Noble gases 240 are used in preference to other gases since noble gases 240 are inert and do not react with the moisture getter 236. In a preferred embodiment, the noble gas 240 is injected into the cavity to a pressure of between 0.1 to 2 Atmospheres (ATM), preferably 1 ATM, at a temperature between 200° C. and 275° C., preferably 255° C.

Although the steps and components illustrated in FIG. 2A-2C will produce a highly reliable hermetic packaged integrated circuit 228, it should be noted that the moisture getter 236 and noble gas 240 in addition to the first and second vacuum bake processes increase the fabrication time and cost of the hermetic packaged integrated circuit 228. Therefore, it is desirable to not be required to utilize those components and processes if a reliable hermetic packaged integrated circuit 228 can be assembled otherwise.

Referring now to FIG. 3A, a diagram illustrating a section A-A of an extracted die 100 in accordance with embodiments of the present invention is shown. In order to show the steps of the preferred embodiment of the present invention, an improvement to the process illustrated in FIGS. 2A-2C, a side view of the extracted die 100 is provided.

Extracted die 100 includes a die substrate 304 including various metallization layers known in the art. On the surface of the die substrate 304 are one or more Aluminum (Al) die pads 104, 112. A passivation layer 308 is applied over the die substrate 304 in order to protect the circuits of the die substrate 304, and the passivation layer 308 is relieved at each of the original die pads 104, 112 in order to provide bonding access.

Where original ball bonds 108 and original bond wires 116 are applied to original die pads 104, 112, the die pads are die pads 104. Where no original ball bonds 108 and original bond wires 116 are applied to original die pads 104, 112, the die pads are die pads 112. FIG. 3A illustrates the point at which the extracted die 100 has been removed from its' original package and one or more original ball bonds 108 and original bond wires 116 are present.

Referring now to FIG. 3B, a diagram illustrating a section A-A of a modified extracted die 312 after original ball bond 108 and original bond wire 116 removal in accordance with embodiments of the present invention is shown. A modified extracted die is an extracted die 100 with the original ball bonds 108 and original bond wires 116 removed. Although in some embodiments original gold ball bonds 108 may be removed by mechanical means, in most cases it is preferable to use chemical removal means by known processes. FIG. 3B illustrates the original ball bond 108 and original bond wire 116 removed from the original die pad 104. Not shown in FIG. 3B is that after removing the original ball bond 108 and original bond wire 116, some amount of intermetallic residue will be present on the original die pads 104. This generally requires removal to make sure there are no impurities or residue on the original die pads 104, 112. The residue removal is referred herein as conditioning the die pads 104, 112. Removal is preferably performed using a mild acid wash. The acid wash is followed by an acid rinse that removes surface oxides present on the original die pads 104, 112. For plating on an Aluminum surface, a Zincate process is used to etch away a very fine layer of Aluminum from the die pads 104, 112 and redeposit a layer of Zinc (Zn) on the die pads 104, 112. The fine layer of Zinc will then act as a catalyst for the Nickel plating to follow.

Once in a clean and flat state, the original die pads 104, 112 are considered bare die pads and are ready to be reconditioned. Reconditioning of the present invention is a process whereby the original die pads 104, 112 are built up by successive and ordered application of specific metallic layers prior to new wire bonding processes.

In one embodiment, after an extracted die 100 is removed from a packaged integrated circuit, only original bond wires 116 are removed—thus leaving original ball bonds 108 on less than all original die pads 104 of the extracted die 100. Original ball bonds 108 must be removed prior to reconditioning original die pads 104. Therefore, in some embodiments the metallic layers of the present invention are provided not to empty die pads 112, but rather original die pads 104 following original ball bond 108 removal.

Referring now to FIG. 3C, a diagram illustrating a section A-A of electroless nickel layer 316 application in accordance with embodiments of the present invention is shown. Electroless plating is more cost effective than electroplating since it does not require expensive photolithography and etch processes. However, electroless processes generally require thicker metal layers for good bondability.

A Nickel (Ni) layer 316 applied over a conditioned conventional Aluminum (Al) bond pad 104, 112 have been found to protect pad surfaces. Nickel possesses a much higher elastic modulus than either Copper (Cu) or Aluminum (Al), which leads Nickel to have high stiffness and fracture toughness and resist deflection and absorb energy during ball bonding processes. Thus, Nickel is a preferred metallic layer 316 for the initial layer application following original die pad 104, 112 conditioning.

An electroless Nickel plating bath is very complex and contains more chemicals (i.e. reducing agents, complexant or chelating agents, stabilizers, etc) than the Nickel source alone. These bath components perform specific functions during the chemical reaction. They are important in order to obtain a good quality Nickel deposit and must be monitored carefully during processing.

The plating rate of Nickel is a controllable parameter during the plating process, which in turn affects the final surface roughness. A fast plating rate will obviously increase the process throughput, but fast plating rates can also result in a rougher Nickel finish. Therefore, a careful balance must be maintained between processing speed and surface quality. If the Nickel surface is too rough, the next successive metal layers to be plated over the Nickel will follow the contours and also result in a rougher surface. Both surface hardness and roughness have a strong effect on wire bondability and bond strength. Harder and rougher surfaces are typically less bondable. For wire bonding applications, the electroless Nickel layer 316 is generally 120-240 microinches thick.

Referring now to FIG. 3D, a diagram illustrating a section A-A of electroless Palladium layer 320 application in accordance with embodiments of the present invention is shown. Electroless Palladium (Pd) 320 is applied over the electroless Nickel (Ni) 316 layer of FIG. 3c in order to inhibit Nickel diffusion into the immersion gold layer 324 applied afterward.

Palladium plating was first investigated as a replacement for purely gold plating in order to alleviate the high cost of gold plating. Palladium and Palladium-Nickel alloys were initially developed for contact wear resistance in connector applications, but other technical advantages were identified as usage grew. Not only is a pure Palladium layer very hard, but it is also very dense which assists as a diffusion barrier. As with the electroless Nickel layer 316, the electroless Palladium layer 320 requires a catalyst pretreatment to prepare the surface for deposition. The metal source is typically a Palladium-Ammonia compound with a hydrazine reducing agent for metal deposition. For wire bonding applications, the electroless Palladium layer 320 is generally 2-4 microinches thick, approximately 2 orders of magnitude thinner than the electroless Nickel layer 316.

Referring now to FIG. 3E, a diagram illustrating a section A-A of immersion Gold layer 328 application in accordance with embodiments of the present invention is shown. The immersion Gold layer 328 is applied over the electroless Palladium layer 320, and provides the top layer of the reconditioned die pads 332. Gold has long been a mature plating process for semiconductor applications. Two types of Gold plating processes through chemical reactions are used today: immersion and autocatalytic. Immersion Gold plating 328 is a self-limiting galvanic displacement process, where no reducing agent is required. For wire bonding applications, the electroless Gold layer 328 is generally at least 1-2 microinches thick, and preferably thicker. Following the process step of FIG. 3E, the die is a reconditioned die 324.

Because the ENEPIG plating process uses gold as the wire bonding layer with gold bond wire, there is no Aluminum (Al)-Gold (Au) interface that can degrade and corrode. Thus, the ENEPIG plating process produces more reliable wire bonding interfaces and is preferred for high temperature applications over previous processes that maintained Al—Au interfaces and utilized moisture getter, noble gas insertion, and vacuum bakes to purge moisture from integrated circuit packages.

Referring now to FIG. 3F, a diagram illustrating a section A-A of new bond wire 340 and ball bonds 336 in accordance with embodiments the present invention is shown. The combination of the electroless Nickel layer 316, electroless Palladium layer 320, and the immersion Gold layer 328 produces a reconditioned die pad 332. New gold bond wires 340 may be thermosonically welded to reconditioned die pads 332, and will produce a new gold ball bond 336 at each new bond wire 340 location.

In thermosonic welding, the interface temperature is typically between 125° C. and 220° C. For ball bonding, the gold bond wire 340 is threaded through a capillary-shaped tool, and a spark melts the end of the wire forming a ball at the bottom of the tool. The bond (weld) is formed when the tool under load presses or deforms the ball against the heated bonding pad and ultrasonic energy is applied, completing the process.

Referring now to FIG. 4A, a diagram illustrating a reconditioned die 324 installed in a hermetic package base 204 in accordance with the preferred embodiment of the present invention is shown. The illustrated assembly is an initial assembly of the repackaged environmentally hardened integrated circuit 408 illustrated in FIG. 4C. The assembly step illustrated in FIG. 4A is between the assembly processes illustrated in FIGS. 3E and 3F.

The reconditioned die 324 is installed within the cavity 212 of a hermetic package base 204. The hermetic package base 204 may be formed from ceramic, metal, or glass materials. Die attach adhesive 216 is applied to the hermetic package base 204 such that when the reconditioned die 324 is installed into the cavity 212, the die attach adhesive 216 makes simultaneous contact with both the hermetic package base 204 and the reconditioned die 324. Die attach adhesive 216 is preferably a low-halide content adhesive, where a low halide compound has less than 10 parts per million (ppm) halide. However, since the preferred embodiment of the present invention lacks Al—Au metallic bonding interfaces, the effect of damaging halides is significantly reduced. Die attach adhesive 216 therefore bonds the reconditioned die 324 to the hermetic package base 204, and protects the integrity of the interior of the repackaged environmentally hardened integrated circuit 408.

Associated with the hermetic package base 204 are a series of package leads 208, which provide interconnection between circuitry of the reconditioned die 324 and circuitry of a printed circuit board on which the repackaged environmentally hardened integrated circuit 408 is eventually mounted. For example, if an S0-24 ceramic package is used for the repackaged environmentally hardened integrated circuit 408, 24 package leads 208 would be present, configured as 12 package leads 208 on each of two opposite sides of the hermetic package base 204. If a PLCC-68 ceramic package is used for the repackaged environmentally hardened integrated circuit 408, 68 package leads 208 would be present, configured as 17 package leads 208 on each of the four sides of the hermetic package base 204.

Referring now to FIG. 4B, a diagram illustrating a reconditioned die rebonded to a package base 404 in accordance with the preferred embodiment of the present invention is shown. After mounting the reconditioned die 324 into the hermetic package base 204 using die attach adhesive 216, new gold bond wires 340 are then attached by thermosonic welding from reconditioned die pads 332 of reconditioned die 324 to package leads 208 or downbonds. Thermosonic welding utilizes ultrasonic and thermal energy to provide strong bonds between the new gold bond wires 340 and reconditioned die pads 332/package leads 316. New gold bond wires 340 are commonly 1-3 mils in diameter, but may be any usable diameter. In a preferred embodiment, new bond wires 340 are Gold (Au) bond wires 340. In other embodiments, new bond wires 340 are Copper (Cu) bond wires 340.

Referring now to FIG. 4C, a diagram illustrating a repackaged environmentally hardened integrated circuit 408 in accordance with the preferred embodiment of the present invention is shown. Repackaged environmentally hardened integrated circuit 408 includes the assembled hermetic package base 404 of FIG. 4B and additional components described below.

After bonding the new gold bond wires 340 between reconditioned die pads 332 and package leads 208 or downbonds, a hermetic package lid 232 is attached to the hermetic package base 204. The hermetic package lid 232 may be formed from ceramic, metal, or glass materials.

A sealing material 244 is present between the assembled hermetic package base 404 and the hermetic package lid 232 to produce a hermetic seal. In a preferred embodiment, sealing material 244 is applied to the hermetic package lid 232 prior to attaching the hermetic package lid 232 to the assembled hermetic package base 404. In one embodiment, the sealing material 244 is sealing glass. In another embodiment, the sealing material 244 is an epoxy. In a third embodiment, the sealing material 244 is a solder compound. After the hermetic package lid 232 is secured to the assembled hermetic package base 404, the repackaged environmentally hardened integrated circuit 408 is ready for electrical, functional, and/or hermeticity testing.

Referring now to FIG. 5A, a flowchart illustrating a reconditioning method for an extracted die 100 in accordance with a first embodiment of the present invention is shown. This process converts an extracted die 100 (with original bond wires 116 and original ball bonds 108 removed) into a reconditioned die 324 of the present invention. Flow begins at block 504.

At block 504 a die 100 is extracted from a previous packaged integrated circuit. The previous package may be a hermetic or a non-hermetic package, and in either case is discarded and not reused. The extracted die 100 is a fully functional semiconductor die that will be utilized in a new repackaged environmentally hardened integrated circuit 408. Flow proceeds to block 508.

At block 508, original ball bonds 108 and original bond wires 116 attached to the original ball bonds 108 are removed from the extracted die 100 by conventional processes. Following removal of the original ball bonds 108 and associated original bond wires 116, some metallic or chemical residues is generally on the surface of each original die pad 104. Flow proceeds to block 512.

At block 512, bare die pads 104, 112 are conditioned. Any metallic and/or chemical residues are removed from each of the original die pads 104, 112 in order to prepare the original die pads 104, 112 for addition of metallic layers to create a reconditioned die 324. Removal of the residues is commonly performed using various acid washes and rinses known in the art. Following removal of the residues and drying the original die pads 104, 112, Flow proceeds to block 516.

At block 516, an electroless Nickel layer 316 is applied to each of the conditioned original die pads 104, 112. Application details of the electroless Nickel layer 316 were described in some detail with respect to FIG. 3C. Flow proceeds to block 520.

At block 520, an electroless Nickel Palladium layer 320 is applied to each of the die pads 104, 112, over the electroless Nickel layer 316. Application details of the electroless Palladium layer 320 were described in some detail with respect to FIG. 3D. Flow proceeds to block 524.

At block 524, an immersion Gold layer 328 is applied to each of the die pads 104, 112, over the electroless Palladium layer 320. Application details of the immersion Gold layer 324 were described in some detail with respect to FIG. 3E. Flow ends at block 524. With the completion of adding the immersion Gold layer 328, the die is now a reconditioned die 324 ready for assembly into a repackaged environmentally hardened integrated circuit 408.

Referring now to FIG. 5B, a flowchart illustrating a reconditioning method for an extracted die 100 in accordance with a second embodiment of the present invention is shown. This process converts an extracted die 100 (with only original bond wires 116 removed) into a reconditioned die 324 of the present invention. Flow begins at block 532.

At block 532 a die 100 is extracted from a previous packaged integrated circuit. The previous package may be a hermetic or a non-hermetic package, and in either case is discarded and not reused. The extracted die 100 is a fully functional semiconductor die that will be utilized in a new repackaged environmentally hardened integrated circuit 408. Flow proceeds to block 536.

At block 536, original bond wires 116 attached to the original ball bonds 108 are removed from the extracted die 100 by conventional processes. The original ball bonds 108 remain. Flow proceeds to optional block 550.

At optional block 540, bare die pads 112 are conditioned. Any metallic and/or chemical residues are removed from each of the original die pads 112 in order to prepare the original die pads 112 for addition of metallic layers to create a reconditioned die 324. Removal of the residues is commonly performed using various acid washes and rinses known in the art. It is likely not feasible to condition die pads 104 since an original ball bond 108 remains on each die pad 104. Following removal of the residues and drying the original die pads 112, Flow proceeds to block 544.

At block 544, an electroless Nickel layer 316 is applied to each of the original die pads 104 with original ball bonds 108 and conditioned original die pads 112. Application details of the electroless Nickel layer 316 were described in some detail with respect to FIG. 3C. Flow proceeds to block 548.

At block 548, an electroless Nickel Palladium layer 320 is applied to each of the die pads 104, 112, over the electroless Nickel layer 316. Application details of the electroless Palladium layer 320 were described in some detail with respect to FIG. 3D. Flow proceeds to block 552.

At block 552, an immersion Gold layer 328 is applied to each of the die pads 104, 112, over the electroless Palladium layer 320. Application details of the immersion Gold layer 324 were described in some detail with respect to FIG. 3E. Flow ends at block 552. With the completion of adding the immersion Gold layer 328, the die is now a reconditioned die 324 ready for assembly into a repackaged environmentally hardened integrated circuit 408.

Referring now to FIG. 6, a flowchart illustrating an assembly method for a repackaged environmentally hardened integrated circuit 408 in accordance with the preferred embodiment of the present invention is shown. Flow begins at block 604.

At block 604 a low-halide content die attach adhesive 216 is applied to the hermetic package base cavity 212. Flow proceeds to block 608.

At block 608, the reconditioned die 324 is placed into the hermetic package base cavity 212. The die attach adhesive 216 acts as a glue between the reconditioned die 324 in the hermetic package base 204, thereby adhering the reconditioned die 324 to the hermetic package base 204. Flow proceeds to block 612.

At block 612, a plurality of new bond wires 340 are bonded between reconditioned die pads 332 of the reconditioned die 324 and package leads 208 as well as downbonds as required. A bond map designates the specific connections to be provided by each of the plurality of new gold bond wires 340. Flow proceeds to block 616.

At block 616, the hermetic package lid 232 is placed on the assembled hermetic package base 404. The hermetic package lid 232 is placed in proper orientation such that the combination of the hermetic package lid 232 and the assembled hermetic package base 404 is hermetically sealed. Sealing material 244 must be already in place prior to seating the lid 232 onto the assembled base 404. Flow proceeds to block 620.

At block 620, the hermetic package lid 232 is sealed to the assembled hermetic package base 404 to create a repackaged environmentally hardened integrated circuit 408. A sealing material 244 known in the art between the hermetic package lid 232 and the hermetic package base 404 is activated at a specific temperature corresponding to the type of sealing material 244 used. Flow continues to block 624.

At block 624, the repackaged environmentally hardened integrated circuit 408 is tested for hermeticity per MIL-SPEC-883H test method 1014.13. In one embodiment, flow proceeds to block 632. In a second embodiment, flow proceeds to optional block 628.

At optional block 628, the package leads 208 are trimmed, if necessary. In some embodiments, the package leads 208 are already trimmed in the hermetic package base 204, and do not need to be trimmed. If the package leads 208 do need to be trimmed, they are trimmed per customer requirements. Flow proceeds to block 632.

At block 632, the repackaged environmentally hardened integrated circuit 408 is electrically tested. Electrical testing includes forcing a fixed current through each package lead 208 and measuring the voltage of the resulting forward-biased diode, and comparing the measured voltage to the expected range. If the repackaged environmentally hardened integrated circuit 408 has passed the hermeticity and electrical tests and the package leads 208 are properly trimmed, the repackaged environmentally hardened integrated circuit 408 is marked and is a complete environmentally hardened integrated circuit ready for use. Flow ends at block 632.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

We claim:

1. A method, comprising:
   extracting a die from an original packaged integrated circuit, wherein the extracted die is a fully functional semiconductor die with one or more ball bonds on one or more die pads of the extracted die;
   modifying the extracted die, comprising removing the one or more ball bonds on the one or more die pads;
   reconditioning the modified extracted die, comprising:
      adding a sequence of nickel, palladium, and gold metallic layers to bare die pads of the modified extracted die;
   placing the reconditioned die into a cavity of a hermetic package base;
   bonding a plurality of bond wires between reconditioned die pads of the reconditioned die to leads of the hermetic package base or downbonds to create an assembled hermetic package base; and
   sealing a hermetic package lid to the assembled hermetic package base to create a new packaged integrated circuit.

2. The method as recited in claim 1, wherein bare die pads of the modified extracted die comprises all metallic and chemical residue, all ball bonds, and all bond wires removed from all die pads of the extracted die.

3. The method as recited in claim 1, wherein only die pads of the modified extracted die that correspond to die pads of the extracted die that previously had a ball bond present are reconditioned, wherein die pads of the modified extracted die that correspond to die pads of the extracted die that did not previously have a ball bond present are not reconditioned.

4. The method as recited in claim 1, wherein adding the sequence of nickel, palladium, and gold metallic layers to bare die pads of the modified extracted die comprises:
adding a layer of nickel to the die pads;
adding a layer of palladium over the layer of nickel; and
adding a layer of gold over the layer of palladium.

5. The method as recited in claim 1, wherein the modified extracted die comprises retaining the one or more ball bonds from the one or more die pads and removing any bond wires from the one or more ball bonds, wherein reconditioning the modified extracted die comprising adding the sequence of nickel, palladium, and gold metallic layers to bare die pads and die pads with one or more ball bonds of the modified extracted die.

6. The method as recited in claim 4, wherein the thickness of each of the metallic layers facilitates reliable ball bonding to the layer of gold.

7. The method as recited in claim 4, wherein after applying the layer of gold: bonding the plurality of bond wires to the gold layer.

8. The method as recited in claim 7, wherein after bonding the plurality of bond wires to the gold layer, the method further comprising:
first vacuum baking the assembled hermetic package base.

9. The method as recited in claim 8, wherein after first vacuum baking the assembled hermetic package base:
sealing the hermetic package lid to the assembled hermetic package base; and
testing the packaged integrated circuit for hermeticity.

10. The method as recited in claim 9, wherein while sealing the hermetic package lid to the assembled hermetic package base, the method further comprising:
second vacuum baking the hermetic package lid and the assembled hermetic package base, wherein second vacuum baking comprises injecting a noble gas into a cavity of the assembled hermetic package base to a pressure between 0.1 to 2 Atmospheres, preferably 1 Atmosphere, at a temperature between 200° C. and 275° C., preferably 255° C.

11. A method, comprising:
extracting a die from an original packaged integrated circuit, wherein the extracted die is a fully functional semiconductor die with one or more ball bonds on one or more die pads of the extracted die;
modifying the extracted die, comprising removing the one or more ball bonds from the one or more die pads;
reconditioning the modified extracted die, comprising adding a sequence of nickel, palladium, and gold metallic layers to bare die pads of the modified extracted die;
placing the reconditioned die into a hermetic package comprising package leads, the hermetic package configured to enclose the reconditioned die; and
bonding a plurality of bond wires between reconditioned die pads of the reconditioned die to the package leads or downbonds.

12. The method as recited in claim 11, wherein placing the reconditioned die into a hermetic package comprising:
bonding, with a die attach adhesive, the reconditioned die within a cavity of the hermetic package.

13. The method as recited in claim 11, wherein bare die pads of the modified extracted die comprises all metallic and chemical residue, all ball bonds, and all bond wires removed from all die pads of the extracted die.

14. The method as recited in claim 13, wherein the die pads of the extracted die are Aluminum, wherein after removing all metallic and chemical residue, all ball bonds, and all bond wires from all die pads of the extracted die, the method further comprising:
etching the die pads of the extracted die with a zincate process; and
redepositing a layer of zinc on the die pads.

15. The method as recited in claim 11, wherein adding a sequence of metallic layers to bare die pads of the modified extracted die comprises:
adding a layer of nickel to the die pads;
adding a layer of palladium over the layer of nickel; and
adding a layer of gold over the layer of palladium.

16. The method as recited in claim 11, wherein the modified extracted die comprises retaining the one or more ball bonds from the one or more die pads and removing any bond wires from the one or more ball bonds, wherein reconditioning the modified extracted die comprising adding the sequence of nickel, palladium, and gold metallic layers to bare die pads and die pads with one or more ball bonds of the modified extracted die.

17. The method as recited in claim 15, wherein the thickness of each of the metallic layers facilitates reliable ball bonding to the layer of gold.

18. The method as recited in claim 15, wherein adding the nickel layer to the die pads comprises including one or more reducing agents, complexants, chelating agents, or stabilizers in a nickel plating application process.

19. The method as recited in claim 15, wherein the layer of palladium comprises:
a palladium-ammonia compound; and
a hydrazine reducing agent to facilitate metal deposition.

20. The method as recited in claim 15, wherein the nickel layer is between 120-240 microinches thick, the palladium layer is between 2-4 microinches thick, and the gold layer is at least one microinch thick.

* * * * *